(12) United States Patent
Mei et al.

(10) Patent No.: US 9,614,694 B2
(45) Date of Patent: Apr. 4, 2017

(54) WIDEBAND RF DEVICE

(71) Applicant: Anaren, Inc., East Syracuse, NY (US)

(72) Inventors: Chong Mei, Jamesville, NY (US); Ying Huang, East Syracuse, NY (US)

(73) Assignee: ANAREN, INC., East Syracuse, NY (US)

(*) Notice: Subject to any disclaimer, the term of this patent is extended or adjusted under 35 U.S.C. 154(b) by 0 days.

(21) Appl. No.: 14/803,529

(22) Filed: Jul. 20, 2015

(65) Prior Publication Data

US 2017/0026201 A1  Jan. 26, 2017

(51) Int. Cl.
| | |
|---|---|
| *H04L 25/02* | (2006.01) |
| *H03H 7/42* | (2006.01) |
| *H03H 7/38* | (2006.01) |
| *H03H 1/00* | (2006.01) |
| *H01L 23/522* | (2006.01) |
| *H01P 5/18* | (2006.01) |
| *H01P 5/02* | (2006.01) |

(Continued)

(52) U.S. Cl.
CPC ........... *H04L 25/0278* (2013.01); *H03H 7/38* (2013.01); *H03H 7/42* (2013.01); *H04L 25/0274* (2013.01); *H04L 25/0276* (2013.01); *H01F 2017/0073* (2013.01); *H01L 23/5227* (2013.01); *H01P 5/028* (2013.01); *H01P 5/10* (2013.01); *H01P 5/187* (2013.01); *H03H 2001/0078* (2013.01)

(58) Field of Classification Search
CPC .. H01P 5/10; H01P 5/187; H01P 5/028; H01P 5/12; H01L 23/5227; H01F 2017/0073; H03H 7/42; H03H 7/38; H03H 2001/0078; H04L 25/0278; H04L 25/0274; H04L 25/0276
See application file for complete search history.

(56) References Cited

U.S. PATENT DOCUMENTS

| | | |
|---|---|---|
| 5,379,006 A | 1/1995 | McCorkle |
| 6,294,965 B1 | 9/2001 | Merrill et al. |
| (Continued) | | |

OTHER PUBLICATIONS

Chen et al., "Adopting the broadside coupled line for the design of an impedance transformer," in Microwave Symposium Digest (MTT), 2011 IEEE MTT-S International, pp. 1-4, Jun. 5-10, 2011.*

(Continued)

*Primary Examiner* — Michelle M Koeth
(74) *Attorney, Agent, or Firm* — David L. Nocilly; Bond, Schoeneck & King, PLLC (57) ABSTRACT

An RF device includes an impedance transformation circuit having a plurality of first RF couplers. Each first RF coupler includes a first portion of a first transmission line winding disposed on at least one first printed circuit board (PCB) and is configured to be electromagnetically coupled to a first portion of a second transmission line winding disposed on at least one second printed circuit board (PCB). The RF device also includes a balun circuit includes a plurality of second RF couplers coupled to balanced port connections, each second RF coupler including a second portion of the first transmission line winding wound around the first portion of a first transmission line winding and configured to be electromagnetically coupled to a second portion of the second transmission line winding wound around the first portion of a second transmission line winding.

30 Claims, 7 Drawing Sheets

(51) Int. Cl.
*H01F 17/00* (2006.01)
*H01P 5/10* (2006.01)

(56) References Cited

U.S. PATENT DOCUMENTS

| | | | | |
|---|---|---|---|---|
| 6,483,415 | B1* | 11/2002 | Tang | H01F 17/0013 333/26 |
| 6,741,814 | B1 | 5/2004 | Kosoff | |
| 6,828,881 | B2* | 12/2004 | Mizutani | H01P 1/20381 333/185 |
| 7,570,129 | B2* | 8/2009 | Kintis | H01P 5/10 333/25 |
| 8,680,935 | B2 | 3/2014 | Muir | |
| 8,896,373 | B2 | 11/2014 | Mei | |
| 2007/0176707 | A1* | 8/2007 | Kirkeby | H01P 5/10 333/26 |
| 2014/0118071 | A1* | 5/2014 | Mei | H03F 1/0288 330/295 |
| 2015/0214919 | A1* | 7/2015 | Qureshi | H03H 7/42 333/5 |
| 2015/0333387 | A1* | 11/2015 | Xiao | H01P 3/08 333/1 |

OTHER PUBLICATIONS

Terman, Radio Engineering, McGraw-Hill, 1937, 2nd Edition, pp. 21-23.*

"Focus Product Selector Guide," Microchip 2013 (accessible at "http://ww1.microchip.com/downloads/en/DeviceDoc/00001308k. pdf", last accessed Feb. 3, 2016, herein "Microchip").*

Huang et al., "Optimum Design of Transformer-Type Marchand Balun Using Scalable Integrated Passive Device Technology," in Components, Packaging and Manufacturing Technology, IEEE Transactions on , vol. 2, No. 8, pp. 1370-1377, Aug. 2012.*

Hettstedt et al., "3D thin film Guanella-balun," in Microwave Conference (GeMiC), 2012 The 7th German , pp. 1-4, Mar. 12-14, 2012.*

* cited by examiner

WIDEBAND RF DEVICE

BACKGROUND OF THE INVENTION

1. Field of the Invention

The present invention relates generally to RF devices, and particularly to broadband coupler and balun devices.

2. Technical Background

An unbalanced line typically includes a signal line conductor and a grounded conductor. The ground conductor may form a ground plane. An unbalanced line is typically employed in the RF portion of the signal path (i.e., between the antenna and the receiver). The signal is typically demodulated from an RF frequency to an intermediate frequency (IF) that is more suitable for the receiver. At this point in the signal path, the use of differential signaling is being considered as a way to improve the receiver performance; and differential signals require a balanced line. Of course, those skilled in the art will appreciate that differential signaling is also used in RF signal paths (i.e., not only in the IF portion of the system). For example, certain antennas are balanced structures that require a balanced feed, and a push-pull power amplifier may be used to provide the differential RF signal.

A balanced line, or balanced signal pair, is a transmission line consisting of two conductors of the same type, each of which have equal impedances along their lengths and equal impedances to ground and to other circuits. In a communications device, such as a cell phone, balanced transmission lines can be used to transmit a differential signal pair; i.e., a pair of signals that is equal in amplitude but opposite in phase (i.e., 180° out of phase). Thus, the sum of the two signals that comprise a differential signal pair is zero. Moreover, when a noise signal is introduced onto a balanced line (the differential transmission path), that noise signal propagates on both signal paths. (Noise of this type is known as common-mode noise since it propagates on both signal paths). Thus, when the two signals that comprise the differential signal pair (plus noise) are subtracted from each other, the noise signal is cancelled and the pair of signals is added together. Thus, differential signals have inherent noise cancellation properties.

A balun is a component that functions as an interface between a balanced transmission line and an unbalanced transmission line. (The word "balun" is shorthand for two words, balanced and unbalanced). Thus, a balun can be used to combine the differential signal pair to form an unbalanced signal; or split an unbalanced signal (i.e., a single ended signal) into a differential signal pair. In addition, the balun may perform impedance conversion between the unbalanced system and the balanced system. Thus, a balun can play a very important role in the system design.

In a push-pull power amplifier application, for example, a first balun can be used at the input stage to split the single ended signal. After amplification, a second balun can be used to combine the differential signals at the output stage.

Consider the following example wherein a 50 Volt DC biased LDMOS transistor is required to provide a 100 watt output. This configuration typically requires the load impedance to match to around 6.25 Ohm. What is needed is a balun with 6.25 Ohm impedance at each of the differential ports, and 50 Ohm impedance at the single ended port. A balun such as this would essentially eliminate the need for a power amplifier output matching network. In general, what is needed in a push-pull power amplifier application, therefore, is a balun that can convert a 50 Ohm single ended port impedance to a specified lower differential port impedance. A balun that can achieve the aforementioned design objective would simplify the design of the power amplifier's input and output matching networks.

One important parameter of a differential amplifier relates to its ability to reject common mode noise. To be specific, this parameter is appropriately known as the common-mode rejection ratio (CMRR); it is the ratio of the differential signal (desired) to the common mode noise (undesirable). Thus, a device that featured an infinite CMRR would be ideal. Stated differently, CMRR quantifies how well the balun rejects common mode signal. In push-pull power amplifier applications, the CMRR is directly related to power amplifier's second order harmonic cancellation. To achieve high linearity and efficiency in push-pull power amplifier, it is desired to have a balun with a good wideband CMRR.

In one approach that has been considered, a balun was realized by winding coaxial cables through ferrite cores. This approach achieved an operating frequency from DC-GHz range. The ferrite core enabled the balun to achieve relatively good performance at low frequency, especially in the frequency range of <100 MHz. However, one drawback to this approach relates to the fact that the insertion losses are significantly increased at higher frequency (>1 GHz) due to the nature of the ferrite core. In a similar approach that employed ferrite beads, the insertion loss of a wire wound balun was approximately 0.8 dB at 900 MHz. Another drawback to this approach relates to the manufacturability of this type of design. For example, an assembly procedure for a balun comprising ferrite beads and coaxial cable requires intensive labor processes. Thus, this approach is expensive and not amenable to cost reduction; moreover, the non-standardized nature of human assembly tends to introduce performance variations.

To improve the manufacturability and the high frequency performance, balun can also be implemented in surface mount packages using printed circuit technology. The manufacturing tolerance control in PCB technology is much more consistent than coaxial balun's assembly process. However, the elimination of coaxial cables and ferrites in the balun design comes with the cost of the significant decrease in even mode impedances.

Figure 1:
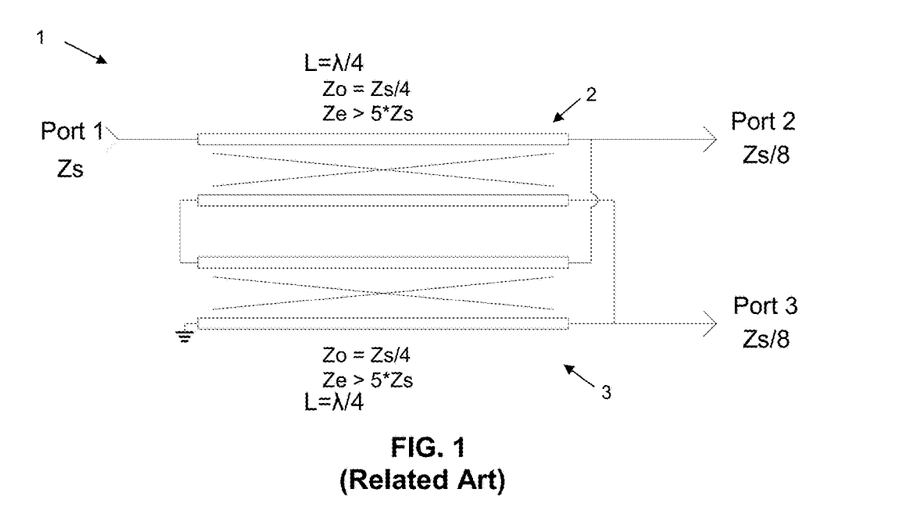
FIG. 1 is a schematic diagram of a conventional inverted Guanella balun.

Referring to FIG. 1, a schematic diagram of a conventional inverted Guanella balun is shown. The Guanella balun 1 is configured to convert an unbalanced port impedance of Zs to a balanced port impedance of Zs/4. The Guanella balun 1 includes two quarter wavelength couplers (2, 3) that are characterized by an even mode impedance of Ze and odd mode impedance of Zo; wherein Zo equals the balanced port impedance Zs/4. One drawback to this approach is that the even mode impedance of Ze limits the bandwidth of the CMRR. Moreover, an insertion loss null may occur around the center frequency in the band due to variations in manufacturing processes.

In another approach, an inverted Marchand balun has been considered. One benefit to this approach is that, unlike the Guanella balun discussed above, it may not require a large even mode impedance (to obtain a reasonable CMRR bandwidth). However, one drawback to this approach relates to the fact that the return loss and insertion loss bandwidths are very limited for the impedance transforming ratio of 4 to 1 and above.

What is needed, therefore, is a RF balun device that addresses the concerns highlighted above. To be specific, what is desirable is a RF balun device that broadens the achievable CMRR and return loss bandwidths. What is also needed is a balun that employs planar printed circuit technology, yet at the same time, provides performance that is comparable to a ferrite coaxial balun.

SUMMARY OF THE INVENTION

The present invention provides a RF balun device that addresses the needs described above. Specifically, the RF balun device of the present invention employs planar printed circuit technology, while providing performance that is comparable to a ferrite coaxial balun. The RF balun device of the present invention broadens the achievable CMRR and return loss bandwidths for a given even mode impedance.

One aspect of the present invention is directed to an RF device configured to propagate an RF signal characterized by a predetermined wavelength ($\lambda$). The RF device has an integrated circuit housing that includes an unbalanced port connection and balanced port connections. An impedance transformation circuit is disposed in the integrated circuit housing and includes a plurality of first RF couplers. At least one of the plurality of first RF couplers is coupled to the unbalanced port connection. Each first RF coupler includes a first portion of a first transmission line winding disposed on at least one first printed circuit board (PCB) and a first portion of a second transmission line winding disposed on at least one second printed circuit board (PCB). Each first portion of the first transmission line winding and each first portion of the second transmission line winding are characterized by a line length substantially equal to $\lambda/8$, the first transmission line winding and the second transmission line winding having a first linewidth and a second linewidth, respectively. A balun circuit is disposed in the integrated circuit housing and includes a plurality of second RF couplers coupled to the balanced port connections. Each second RF coupler includes a second portion of the first transmission line winding integrally connected to the first portion of a first transmission line winding and a second portion of the second transmission line winding integrally connected to the first portion of a second transmission line winding. The first transmission line winding is configured to be electromagnetically coupled to the second transmission line winding. The second portion of the first transmission line winding and the second portion of the second transmission line winding are characterized by a line length substantially equal to $\lambda/8$.

In one embodiment, the impedance transformation circuit is configured convert the unbalanced port impedance (Zs) to a balanced port impedance of Zs/4.

In one embodiment, the balun circuit is characterized by a 1:1 impedance transformation.

In one embodiment, the at least one first PCB includes a plurality of first PCBs and the at least one second PCB includes a plurality of second PCBs.

In one version of the embodiment, a first linewidth is distributed between the first plurality of PCBs and the second linewidth is distributed between the second plurality of PCBs.

In one version of the embodiment, the first plurality of PCBs includes a first PCB and a third PCB, and wherein the first transmission line winding includes a first conductor disposed on the first PCB and a third conductor disposed on the third PCB, the third conductor being disposed in parallel with the first conductor, and wherein each of the first conductor linewidth and the third conductor linewidth are approximately equal to one-half the first linewidth.

In one version of the embodiment, the second plurality of PCBs includes a second PCB and a fourth PCB, and wherein the second transmission line winding includes a second conductor disposed on the second PCB and a fourth conductor disposed on the fourth PCB, the fourth conductor being disposed in parallel with the second conductor, and wherein each of the second conductor linewidth and the fourth conductor linewidth are approximately equal to one-half the second linewidth.

In one embodiment, the first transmission line winding includes a first-first transmission line segment and a second-first transmission line segment, the first-first transmission line segment and the second-first transmission line segment being wound in opposite directions, and wherein the second transmission line winding includes a first-second transmission line segment and a second-second transmission line segment, the first-second transmission line segment and the second-second transmission line segment being wound in opposite directions.

In one embodiment, the first portion of the first transmission line winding and the second portion of the first transmission line winding form a substantially contiguous at least one first spiral winding, and wherein the first portion of the second transmission line winding and the second portion of the second transmission line winding form a substantially contiguous at least one second spiral winding.

In one version of the embodiment, the at least one first PCB includes a first PCB and a third PCB, and wherein the at least one first spiral winding includes a first spiral winding disposed on the first PCB and a third spiral winding on the third PCB.

In one version of the embodiment, the at least one second PCB includes a second PCB and a fourth PCB, and wherein the at least one second spiral winding includes a second spiral winding disposed on the second PCB and a fourth spiral winding on the fourth PCB.

In one embodiment, the plurality of first RF couplers includes a first impedance transformation coupler coupled to the unbalanced port and a second impedance transformation coupler coupled to the first impedance transformation coupler, and wherein the plurality of second couplers includes a first balun coupler coupled to the first impedance transformation coupler at a first interconnection connection point and a second balun coupler coupled to the first impedance transformation coupler at a second interconnection point.

In one version of the embodiment, the second impedance transformation coupler is coupled to the first impedance transformation coupler by at least one first internal via, and wherein the first balun coupler is coupled to the second balun coupler by at least one second internal via.

In one embodiment, an electrical length of the first portion of the first transmission line winding is different than an electrical length of the second portion of the first transmission line winding, and wherein an electrical length of the first portion of the second transmission line winding is different than an electrical length of the second portion of the second transmission line winding.

In one embodiment, an odd-mode impedance of the plurality of first RF couplers is different than an odd-mode impedance of the plurality of second RF couplers.

In one version of the embodiment, an odd-mode impedance of one of the plurality of first RF couplers is different than an odd-mode impedance of another one of the plurality of first RF couplers.

In one version of the embodiment, an odd-mode impedance of one of the plurality of second RF couplers is different than an odd-mode impedance of another one of the plurality of second RF couplers.

In one embodiment, an electrical line length of the plurality of first RF couplers is different than an electrical line length of the plurality of second RF couplers.

In one version of the embodiment, an electrical line length of one of the plurality of first RF couplers is different than an electrical line length of another one of the plurality of first RF couplers.

In one version of the embodiment, an electrical line length of one of the plurality of second RF couplers is different than an electrical line length of another one of the plurality of second RF couplers.

In one embodiment, λ corresponds to a center frequency of a signal bandwidth characterizing return loss, insertion loss or CMMR, the signal bandwidth being approximately double that of a Guanella balun having a line length equal to λ/4 and a system impedance, an odd-mode impedance, and an even-mode impedance equal to system impedance, an odd-mode impedance, and an even-mode impedance of the RF device.

In one embodiment, each of the first RF couplers is comprised of two inter-digitally connected traces vertically aligned and spaced by thin dielectric layers, and wherein each of the second RF couplers is comprised of two inter-digitally connected traces vertically aligned and spaced by the thin dielectric layers.

In one version of the embodiment, each of the first RF couplers and the second RF couplers are wound in a spiral form factor.

In one version of the embodiment, each of the first RF couplers are wound inside corresponding ones of the second RF couplers, the first RF couplers being wound in the same direction as the second RF couplers.

In one version of the embodiment, each of the second RF couplers are wound inside corresponding ones of the first RF couplers, the second RF couplers being wound in the same direction as the first RF couplers.

In one embodiment, the integrated circuit housing is configured as a surface mount (SMT) housing.

In one embodiment, the integrated circuit housing has a device footprint of less than 0.2 square inches.

In one version of the embodiment, the device footprint is approximately equal to about 0.1 square inches.

In one embodiment, the RF device is characterized by an insertion loss bandwidth that is substantially between −0.25 dB and −0.5 dB in a band of frequencies substantially between 190 MHz and 900 MHz, and wherein the insertion loss bandwidth does not include a notch within the band of frequencies.

In one embodiment, the RF device is characterized by a return loss bandwidth that is substantially between −12 dB and −25 dB in a band of frequencies substantially between 190 MHz and 900 MHz, and wherein the return loss bandwidth does not include a notch within the band of frequencies.

In one embodiment, the RF device is characterized by a CMMR bandwidth that is less than or equal to −30 dB in a band of frequencies substantially between 120 MHz and 975 MHz.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The accompanying drawings are included to provide a further understanding of the invention, and are incorporated in and constitute a part of this specification. The drawings illustrate various embodiments of the invention and together with the description serve to explain the principles and operation of the invention.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the balun of the present invention is shown in FIG. 2, and is designated generally throughout by reference numeral 10.

Figure 2:
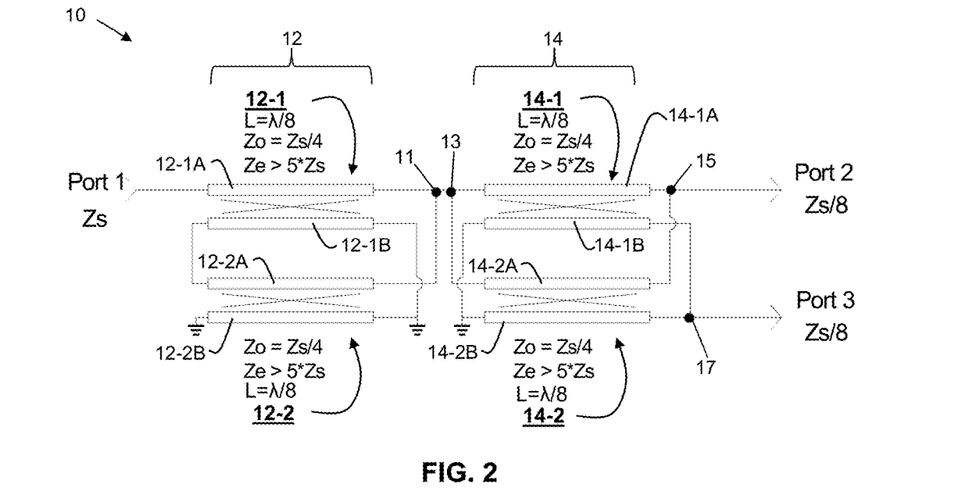
FIG. 2 is a schematic diagram of a wideband RF balun device assembly in accordance with the present invention.

As embodied herein, and depicted in FIG. 2, a schematic diagram of a RF balun device 10 in accordance with the present invention is disclosed. The RF balun device 10 includes an impedance transformer 12 coupled to a 1:1 balun 14, and is further configured to convert the unbalanced port (Port 1) impedance of Zs to a balanced port impedance of Zs/4 while, at the same time, providing improved performance (e.g., bandwidth) characteristics. (Note that the balanced port includes Port 2 and Port 3; each is characterized by an impedance of Zs/8).

The impedance transformer 12 includes a first transformer coupler 12-1 disposed in parallel with a second transformer coupler 12-2. The first transformer coupler includes coupled transmission lines (12-1A, 12-1B) that are one-half the length, i.e., λ/8, of the coupled transmission lines employed in conventional balun devices (e.g., See, FIG. 1). In like fashion, the second coupler 12-2 includes coupled transmission lines (12-2A, 12-2B) that have a length substantially equal to λ/8, wherein λ represents the wavelength corresponding to the center frequency of signals propagating in the RF device 10.

The balun 14 also includes a first balun coupler 14-1 disposed in parallel with a second balun coupler 14-2. For efficiency reasons, the first balun coupler 14-1 and the second balun coupler 14-2 are substantially identical, or similar to the first transformer coupler 12-1 and the second transformer coupler 12-2, respectively. See FIGS. 6C-6F. Thus, the first balun coupler 14-1 also includes coupled transmission lines (14-1A, 14-1B) that are one-half the length, i.e., λ/8, of the coupled transmission lines employed in conventional balun devices (e.g., See, FIG. 1). As before, the second balun coupler 14-2 includes coupled transmission lines (14-2A, 14-2B) that have a length substantially equal to one-eighth of a wavelength (λ/8).

As those skilled in the art will appreciate, each transmission line (12-1A, 12-1B; 12-2A, 12-2B; 14-1A, 14-1B; and 14-2A, 14-2B) must have the requisite linewidth in order to exhibit the desired impedance characteristics. Each coupler (12-1, 12-2, 14-1 and 14-2) is specified by a desired odd-mode impedance (Zo) and an even mode impedance (Ze). At the same time, the RF device package must have a suitable size and shape (i.e., form factor), and possess certain manufacturing efficiencies (i.e., be relatively easy to produce). In order to meet these requirements, each transmission line (12-1A, 12-1B; 12-2A, 12-2B; 14-1A, 14-1B; and 14-2A, 14-2B) is implemented using the parallel arrangement shown in FIGS. 6C-6F. Specifically, each transmission line includes a first conductor disposed in parallel with a second conductor; each conductor has a linewidth that is one-half of the linewidth required for a given impedance. Thus, transmission line 12-1A is implemented by a half-linewidth conductor 12-1A1 (See FIG. 6C) disposed in parallel with a second half-linewidth conductor 12-1A2 (See FIG. 6E).

Briefly stated then, each conductor (12-1A1, 12-1A2) has a length substantially equal to λ/8, and a linewidth substantially equal to one-half the linewidth required for the desired impedance. Each transmission line (12-1A, 12-1B; 12-2A, 12-2B; 14-1A, 14-1B; and 14-2A, 14-2B) is implemented in the same way.

Thus, in one example, the RF device 10 comprises four λ/8 couplers of even mode impedance (Ze) and odd mode impedance (Zo) wherein the required odd mode impedance (Zo) equals the balanced port impedance Zs/4 and the even mode impedance (Ze) is equal to 5·Zs, wherein Zs is the system impedance. In accordance with the present invention, if the even mode impedance (Ze) is increased; the RF device will exhibit a wider bandwidth for both insertion loss and CMRR. Moreover, slight deviations from the above specified length and impedance parameters would not affect the balun performance significantly. In fact, the present invention recognizes that the performance of the RF device 10 may be optimized by introducing slight differences in the odd mode impedances and electrical lengths of some or all of the couplers.

Figure 3A:
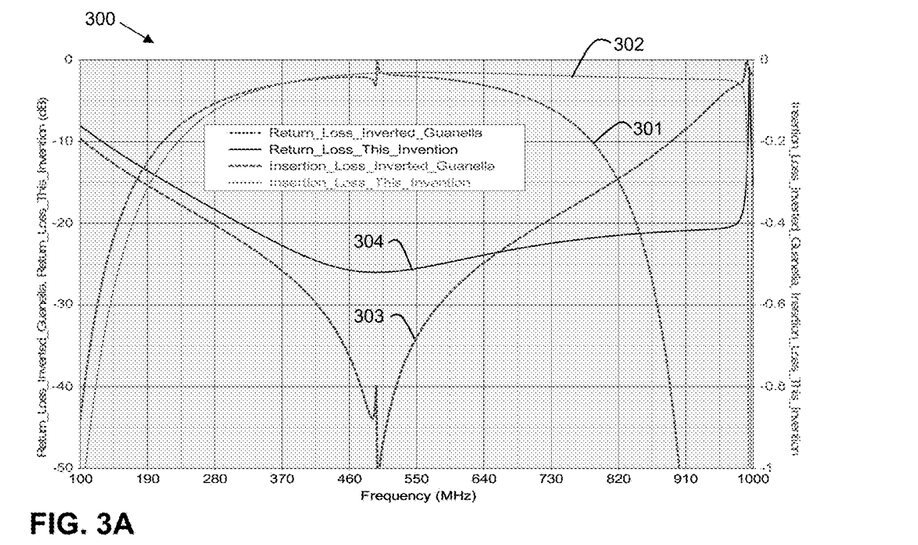
FIGS. 3A-3B are charts comparing the performance of the wideband RF balun device of the present invention to a conventional inverted Guanella balun.
Figure 3B:
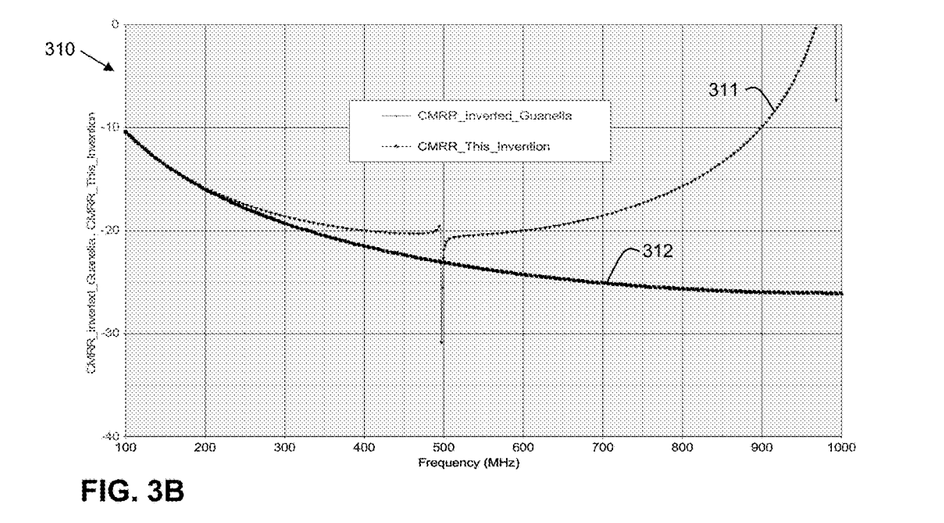

Referring to FIGS. 3A-3B, charts comparing the performance of an embodiment of the present invention to the conventional inverted Guanella balun (See FIG. 1) are disclosed. In this example, the even mode impedances of the couplers are equal to 12.5 Ohms in order to convert the unbalanced 50 Ohm system impedance to a balanced impedance of 12.5 Ohms. The even mode impedance of each coupler in this example embodiment is equal to about 250 Ohms. The center frequency is set to be 500 MHz. This is a fair comparison, since the required total length of the couplers 12-1 and 14-1 (and couplers 12-2 and 14-2) are the same as in the couplers of the conventional device (i.e., λ/4). (The length of coupler 12-1 (λ/8) plus the length of coupler 14-1 (λ/8) equals λ/4). Moreover, the coupler impedances are the same as well; this implies that both baluns can be realized using a similar stackup in the same circuit area.

Referring to FIG. 3A, a chart 300 comparing the insertion loss 301 and the return loss 303 of the conventional Guanella balun (See FIG. 1) with the present invention's insertion loss 302 and the return loss 304, respectively, is disclosed. The return loss 303 bandwidth the inverted Guanella provides a 20 dB return loss in the band of about 280-700 MHz, i.e., fractional bandwidth of 80%. In contrast, the present invention provides a 20 dB return loss in the band of about 300 MHz to 950 MHz. Accordingly, the invention achieves a fractional bandwidth of about 105%. The insertion loss 302 bandwidth of the present invention is also much wider than the insertion loss 301 bandwidth of the conventional device.

Referring to FIG. 3B, a chart 310 comparing the common mode rejection ratio (CMRR) 311 of the conventional Guanella balun (See FIG. 1) with the CMRR 312 of the present invention is disclosed. The CMRR 311 of the conventional device is about 18 dB (or better) in a band between about 300 MHz to 700 MHz. The present invention provides a CMRR 312 that is about 18 dB (or better) in a band between about 300 MHz to 1 GHz. Thus, the present invention exhibits a marked improvement over the conventional device.

More importantly, FIGS. 3A and 3B show that each performance curve (301, 303, and 311) of the conventional Guanella balun exhibits an undesirable notch near the center frequency (500 MHz) that is eliminated by the present invention. (Note that the present invention creates a notch at about 1.0 GHz, which is essentially, out of band). These notches typically result when the two couplers of the conventional Guanella device 1 are not identical. Depending on the degree difference between the two couplers, the notches can become quite obvious and halve the usable contiguous bandwidth of the conventional balun 1. In contrast, the four couplers (12-1, 12-2, 14-1 and 14-2) of the present invention can be slightly different from each other without introducing the aforementioned undesirable notches. As a result of this unique feature, the manufacturing tolerances of the present invention are not as strict. The present invention, therefore, provides a device that can be efficiently manufactured (i.e., that reduces the waste associated with "out-of-spec" parts).

Figure 4A:
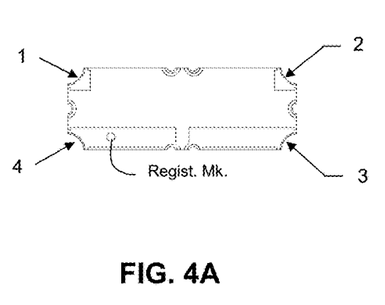
FIGS. 4A-4B are top and bottom views of the wideband RF balun device assembly in accordance with the present invention.
Figure 4B:
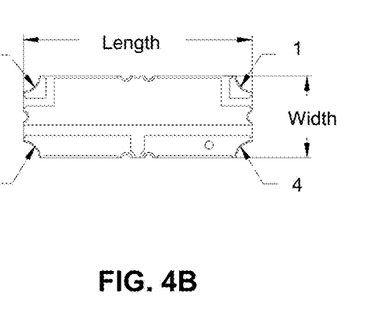

Referring to FIGS. 4A-4B, top and bottom views of an RF device 10 in accordance with the present invention are disclosed. FIG. 4A shows the top of the part, whereas FIG. 4B shows the bottom view. In this example, the RF device 10 is configured and optimized for a frequency band between 320 MHz to 860 MHz; the balun in RF device 10 is configured to convert an unbalanced 50 Ohm port into balanced 12.5 Ohm ports. In one embodiment, the length of the RF device is about one half inch (i.e., 0.56") and the width is less than a quarter inch (i.e., 0.2"). When one compares the form factor of the device depicted in FIGS. 4A-B with a conventional coaxial/ferrite assembly having the same (or similar) design specifications, the RF part 10 shown in FIGS. 4A-B provides significant size reduction.

Figure 5:
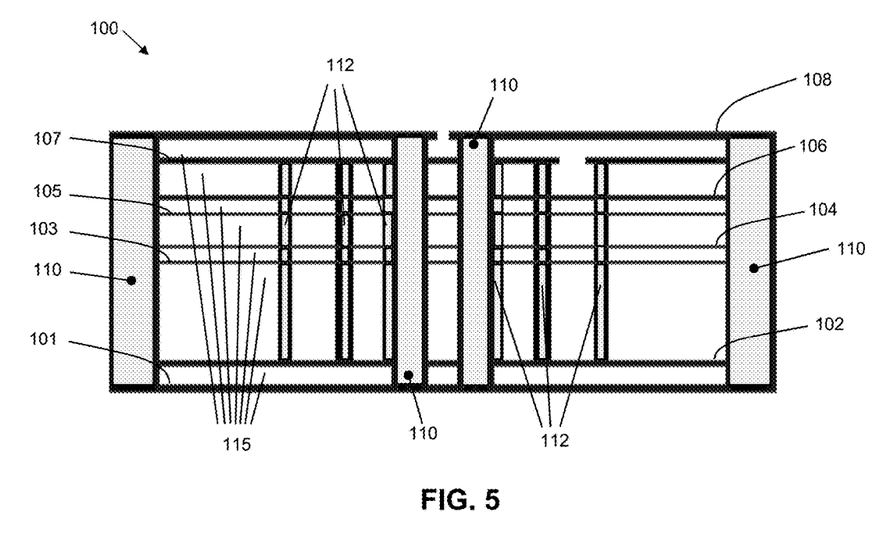
FIG. 5 is a sectional view of the planar stack-up of the RF balun device depicted in FIG. 4.

Referring to FIG. 5, a sectional view of the planar stack-up 100 of the RF device 10 depicted in FIG. 4 (and shown schematically in FIG. 2) is disclosed. The metal layers 101-108 are arranged from top to bottom within in stackup 100; of course, dielectric material 115 is disposed between the adjacent layers of stackup 100. The stackup 100 also includes through-vias 110 and internal buried vias 112. Obviously, the elements 101-108, 110 and 112 are configured to implement the schematic depicted in FIG. 2. This implementation is shown in greater detail below at FIGS. 6A-6J.

Figure 6A:
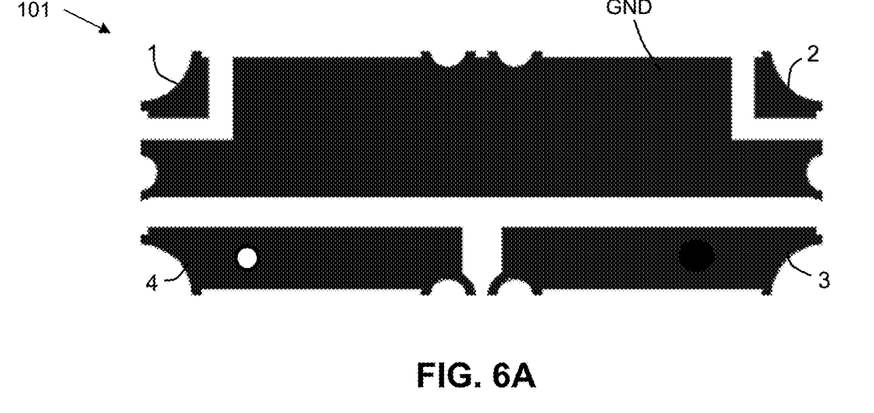
FIGS. 6A-6J are circuit layout diagrams showing the individual layers and interconnecting vias for the RF balun device planar stack-up depicted in FIG. 5.
Figure 6B:
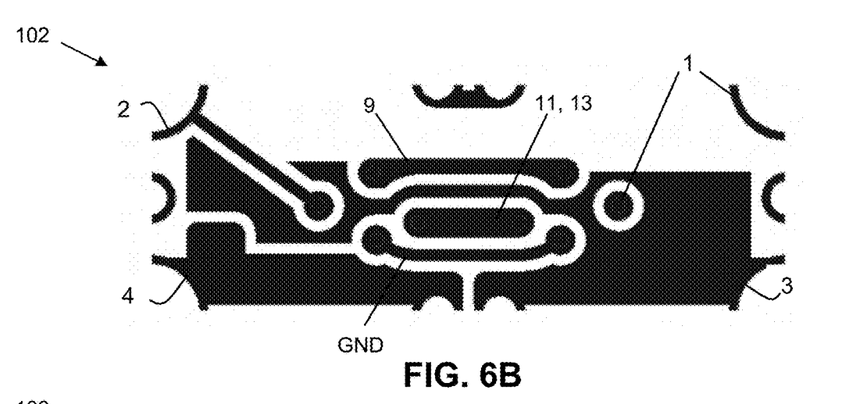
Figure 6C:
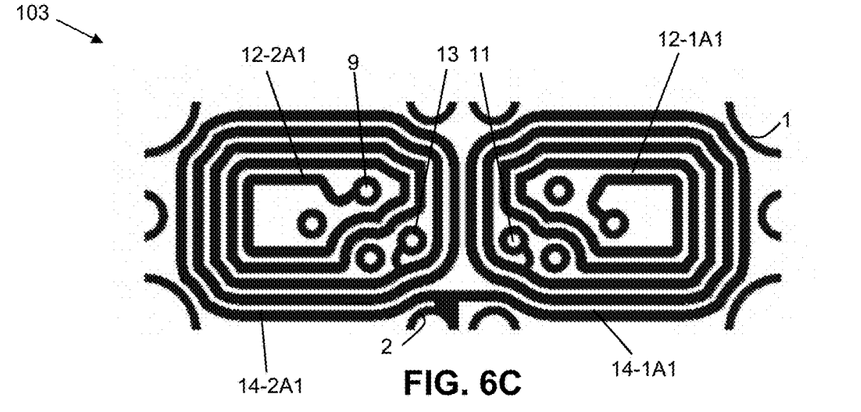
Figure 6D:
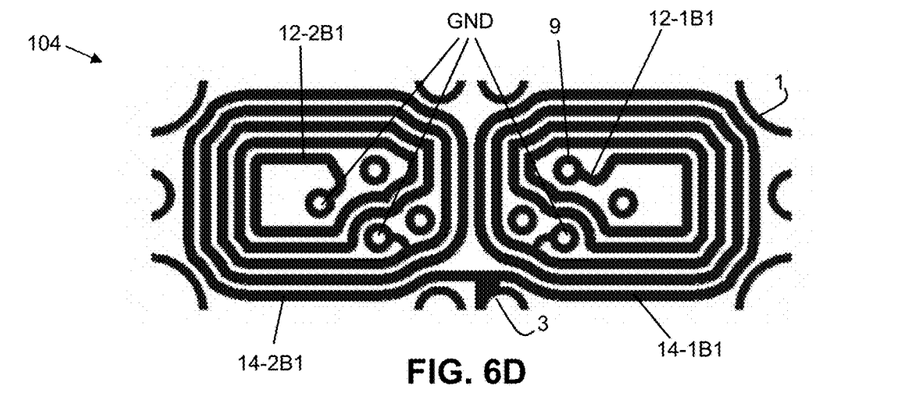
Figure 6E:
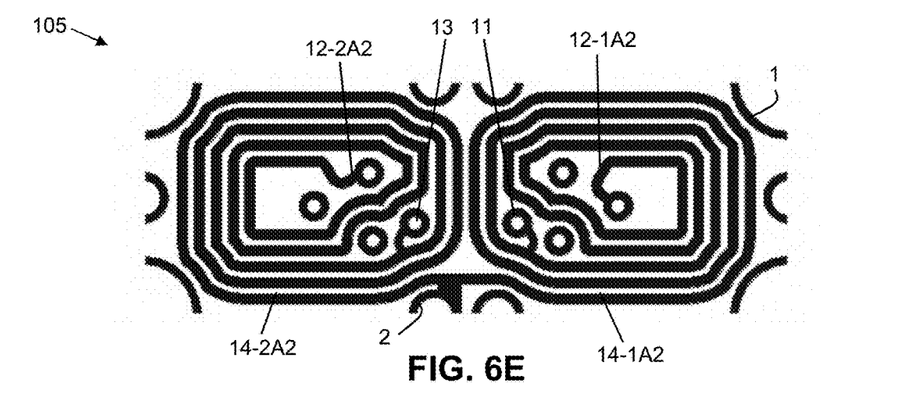
Figure 6F:
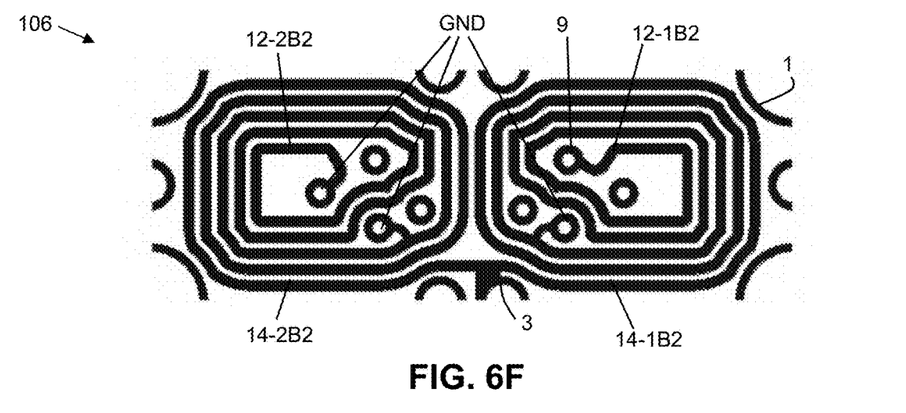
Figure 6G:
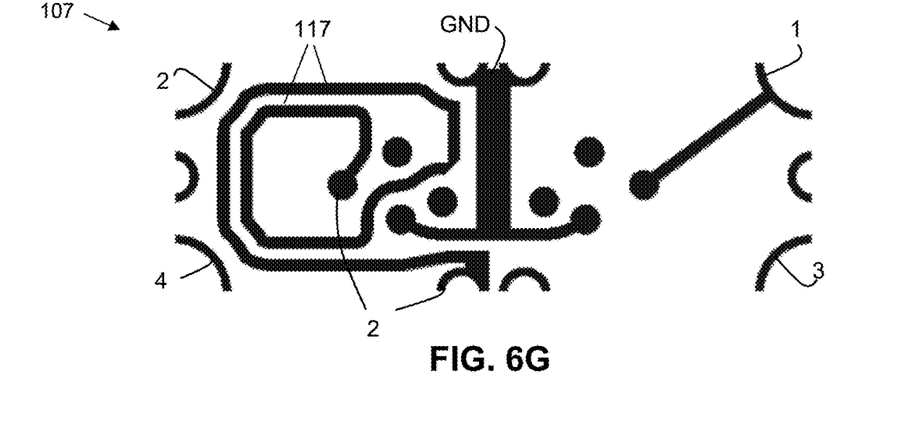
Figure 6H:
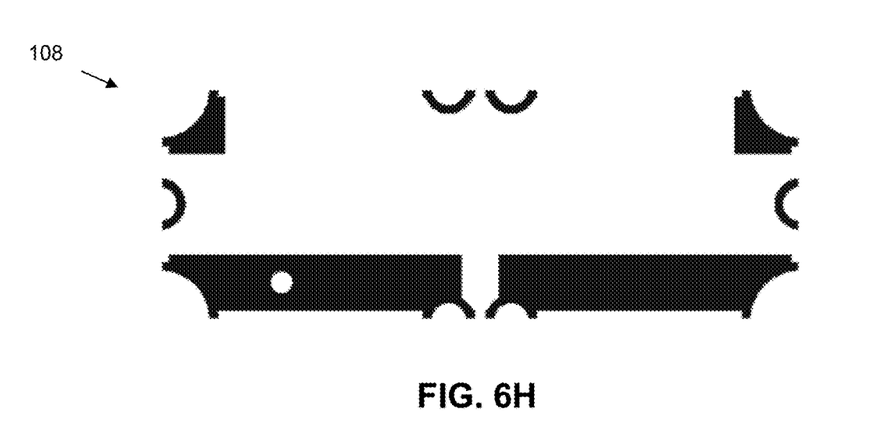

Referring to FIGS. 6A-6J, printed circuit layout diagrams showing the individual layers and interconnecting vias (for each printed circuit layer) in the planar stack-up depicted in FIG. 5 are disclosed. FIG. 6A shows the bottom layer 101 and it includes the landing pads for the through vias 110; thus, landing pads are provided for each pin (1-4) and for ground (GND). The through vias 110 are also interconnected to the device 10 exterior (at FIG. 6J) via layer 108 (which is shown at FIG. 6H). Briefly stated, signal pins 1-4 and ground are coupled to the internal layers 102-107 by way of the through vias 110. This arrangement is quite suitable for the easy-to-use surface mount device 10 depicted in FIGS. 4A-4B.

Figure 6I:
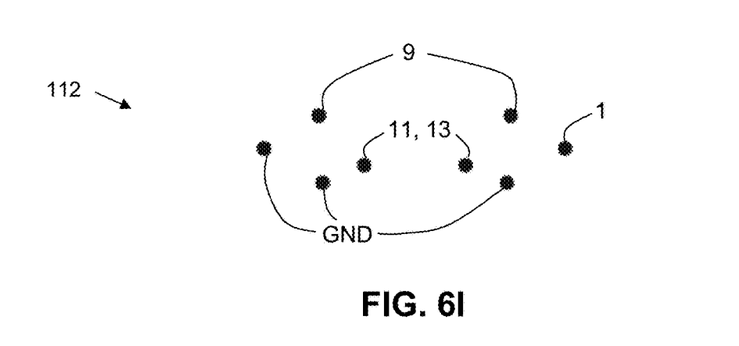
Figure 6J:
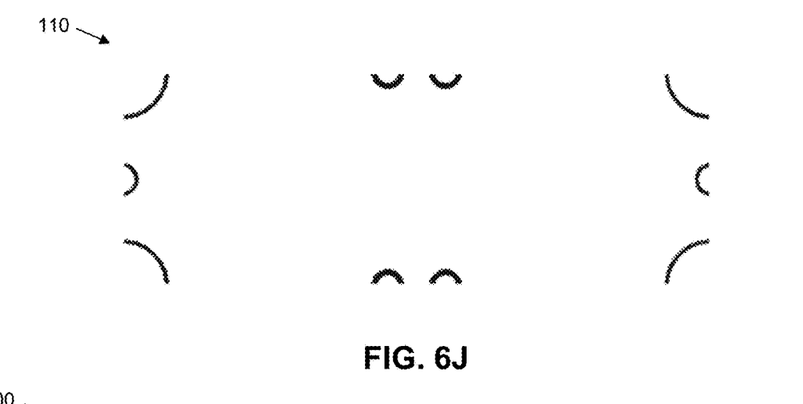

Referring to FIG. 6B, the interconnections between the internal buried vias 112 that implement interconnection points 9, 11, 13 and GND (ground)—shown in the schematic at FIG. 2—are disclosed. This view also shows the connection between pin 2 and the internal via 112. The mirror image of the pin 2 via is used to provide an internal connection for pin 1. A cross section of the internal vias 112 that implement interconnection points 9, 11, 13 and GND (ground) are also shown at FIG. 6I. Thus, the internal vias 112 are configured to provide the internal interconnection paths between layers 102 and 107.

Referring to FIG. 6G, the features implemented by layer 107 are shown. To be specific, a lateral metal trace is provided between pin 1 and an internal via 112. Layer 107 may also include a tuning inductor 117 (not shown in FIG. 2). The inductor 117 may be employed to tune out parasitic effects and improve the overall performance of RF device 10.

Referring to FIGS. 6C-6F, the layers 103-106, which are used to implement the couplers (12-1, 12-2, 14-1 and 14-2) are disclosed. The layouts for these couplers are configured to optimize the balun performance.

Pin 1 (FIG. 6G) is connected to the input of transmission line 12-1A by way of the interior via nodes for conductor 12-1A1 (FIG. 6C) and conductor 12-1A2 (FIG. 6E). As explained above, the transmission line 12-1A1 is implemented by two parallel conductors; conductor 12-1A1 is disposed on layer 103 while conductor 12-1A2 is disposed on layer 105 (with layer 104 disposed therebetween). The transmission line 12-1A is designed to have a length substantially equal to $\lambda/8$ and a linewidth to implement the desired even mode impedance. Thus, each conductor (12-1A1, 12-1A2) has a length substantially equal to $\lambda/8$ and a linewidth that is half of the specified linewidth. As a result, conductor 12-1A1 and conductor 12-1A2 extend from the input node to connector node 11. At this point, the winding is used to implement transmission line 14-1A. Like transmission line 12-1A, transmission line 14-1A is implemented using two conductors—14-1A1 is disposed on layer 103 and conductor 14-1A2 is disposed on layer 105—that have a length substantially equal to $\lambda/8$ and a linewidth that is half of the specified linewidth. As a result, transmission line 14-1A extends from node 11 to port 2.

Continuing with FIGS. 6C and 6E, transmission line 14-2A—again, implemented using conductor 14-2A1 (FIG. 6C) and conductor 14-2A2 (FIG. 6E)—extends from port 2 to node 13; and transmission line 12-2A—implemented by conductors 12-2A1, 12-2A2—extends from node 13 to node 9. See schematic at FIG. 2. In summary, layers 103 and 105 are configured to implement one-half of each of the four couplers (12-1, 12-2, 14-1 and 14-2).

Accordingly, layers 104 and 106 are configured to implement the remaining half of each of the four couplers (12-1, 12-2, 14-1 and 14-2). As per the schematic, transmission line 12-1B—implemented by conductor 12-1B1 (FIG. 6D) and conductor 12-1B2 (FIG. 6F)—extends from node 9 to a ground node; transmission line 14-1B—implemented by conductor 14-1B1 (FIG. 6D) and conductor 14-1B2 (FIG. 6F)—extends from the same ground node to port 3. In similar fashion, transmission line 14-2B—implemented using conductor 14-2B1 (FIG. 6D) and conductor 14-2B2 (FIG. 6F)—extends from port 3 to another ground node.

Briefly stated, each of the four couplers (12-1, 12-2, 14-1 and 14-2) is implemented by four inter-connected traces that are vertically aligned and spaced by thin dielectric layers. In accordance with the invention, a thinner linewidth can be used to increase the even-mode impedance while maintaining the desired odd mode impedance. Moreover, each of the four couplers can be realized by using a spiral form factor to further increase their even mode impedances. Also note that the conductors used to implement the two couplers (12-1, 12-2) comprising the impedance transformer 12 are disposed in the interior of each spiral winding (used to form the coupler 14-1 and the coupler 14-2, respectively, comprising the balun 14). Further, the conductors on the left (12-2A1, 12-2A2) are wound counter-clockwise while the conductors on the right (12-1A1, 12-1A2) are wound in the opposite direction (clockwise).

In an alternate embodiment of the device shown in FIG. 2, the couplers 14-1 and 14-2 may be wound inside and in the same direction as the couplers 12-1 and 12-2, respectively. The balun CMRR performance relies more on the high even mode impedances of the two couplers of 14-1 and 14-2 than the ones 12-1 and 12-2. Both layout arrangements, i.e., winding couplers 12 (12-1 and 12-2) inside couplers 14 (14-1 and 14-2), or alternatively, winding couplers 14 inside couplers 12, utilize the flux created by couplers of 12-1 and 12-2 to increase the even mode impedances of the couplers 14-1 and 14-2 to thus optimize the balun 14 performance.

Figure 7:
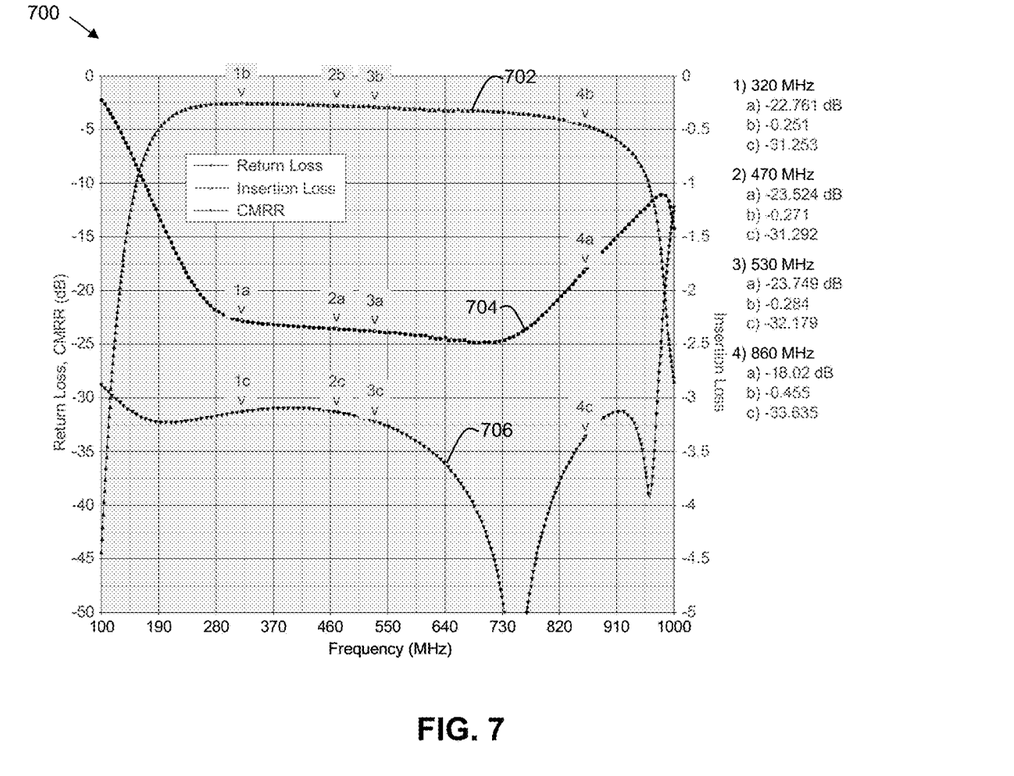
FIG. 7 is a chart illustrating the performance of the RF balun device of the present invention.

Referring to FIG. 7, a chart 700 illustrating the performance of the present invention is disclosed. The insertion loss curve 702 is between 0.0 and −0.5 dB from about 235 MHz to about 900 MHz. The return loss curve 704 and the CMRR curve 706 demonstrate a bandwidth in a range between about 320 MHz-860 MHz. In this band, the return loss 704 is better than 18 dB, and the CMRR is better than 30 dB CMRR across the band. The RF device 10 is also characterized by an insertion loss, a return loss and a CMRR that do not have nulls at the center frequency of the bandwidth.

While this RF device example discloses a balun design that converts an unbalanced impedance of 50 Ohms to a balanced 12.5 Ohm in the frequency band of 300 MHz to 950 MHz, the circuit schematic (FIG. 2) may be adapted to designs for other frequency ranges having different impedance transformation ratios. Even though the RF device 10 is implemented using printed circuit technology (e.g., limited even mode impedance), its performance is comparable to that of a ferrite coaxial balun. Thus, the present invention provides a compact RF device (with an impedance transformer stage and a balun stage) using stripline technology to provide a low insertion loss and excellent CMRR across the wideband frequency.

The RF device is configured to convert a single ended port impedance to a lower differential port impedance over wide frequency range; in one example, the device 10 converts a single ended impedance of 50 Ohm to differential impedance of 12.5 Ohm over a frequency range of 320 MHz-860 MHz (i.e., a fractional bandwidth of 92%).

The RF device of the present invention can be implemented in a surface mount (SMT) package that is easy to use. The RF device can be further implemented using planar print circuit board technology that is efficient from a manufacturing standpoint. Moreover, the present invention provides the above described performance and form factor advantages to implement a balun assembly that avoids the use of ferrite materials or coaxial cables. Thus, the performance variation from the relative position of coaxial cables with respect to each other or with respect to the ferrite cores can be eliminated during the manufacturing process.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. There is no intention to limit the invention to the specific form or forms disclosed, but on the contrary, the intention is to cover all modifications, alternative constructions, and equivalents falling within the spirit and scope of the invention, as defined in the appended claims. It is, therefore, to be understood that the foregoing embodiments are presented by way of example only and that, within the scope of the appended claims and equivalents thereto; inventive embodiments may be practiced otherwise than as specifically described and claimed.

All references, including publications, patent applications, and patents, cited herein are hereby incorporated by reference to the same extent as if each reference were individually and specifically indicated to be incorporated by reference and were set forth in its entirety herein.

All definitions, as defined and used herein, should be understood to control over dictionary definitions, definitions in documents incorporated by reference, and/or ordinary meanings of the defined terms.

The use of the terms "a" and "an" and "the" and similar referents in the context of describing the invention (especially in the context of the following claims) are to be construed to cover both the singular and the plural, unless otherwise indicated herein or clearly contradicted by context.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A radio frequency (RF) device configured to propagate an RF signal characterized by a predetermined wavelength ($\lambda$), the RF device comprising:
   an integrated circuit housing including an unbalanced port connection and balanced port connections;
   an impedance transformation circuit disposed in the integrated circuit housing and including a plurality of first RF couplers, wherein the plurality of first RF couplers includes a first impedance transformation coupler coupled to the unbalanced port connection and a second impedance transformation coupler coupled to the first impedance transformation coupler, wherein each of the plurality of first RF couplers includes a first portion of a first transmission line winding disposed on at least one first printed circuit board (PCB) and a first portion of a second transmission line winding, wherein the first portion of the second transmission line winding is connected to ground and is disposed on at least one second printed circuit board (PCB), the first portion of the first transmission line winding and the first portion of the second transmission line winding being characterized by a line length substantially equal to $\lambda/8$, the first transmission line winding and the second transmission line winding having a first linewidth and a second linewidth, respectively; and a balun circuit disposed in the integrated circuit housing and including a plurality of second RF couplers coupled to the balanced port connections, wherein the plurality of second RF couplers includes a first balun coupler coupled to the first impedance transformation coupler and a second balun coupler coupled to the first impedance transformation coupler, each of the plurality of second RF couplers including a second portion of the first transmission line winding integrally connected to the first portion of the first transmission line winding and a second portion of the second transmission line winding, wherein the second portion of the second transmission line winding is connected to ground, the first transmission line winding being configured to be electromagnetically coupled to the second transmission line winding, the second portion of the first transmission line winding and the second portion of the second transmission line winding being characterized by a line length substantially equal to $\lambda/8$.

2. The device of claim 1, wherein the impedance transformation circuit is configured to convert an unbalanced port impedance (Zs) to a balanced port impedance of Zs/4.

3. The device of claim 1, wherein the balun circuit is characterized by a 1:1 impedance transformation.

4. The device of claim 1, wherein the at least one first PCB includes a first plurality of PCBs and the at least one second PCB includes a second plurality of PCBs.

5. The device of claim 4, wherein the first linewidth is distributed between the first plurality of PCBs and the second linewidth is distributed between the second plurality of PCBs.

6. The device of claim 4, wherein the first plurality of PCBs includes a first PCB and a third PCB, and wherein the first transmission line winding includes a first conductor disposed on the first PCB and a third conductor disposed on the third PCB, the third conductor being disposed in parallel with the first conductor, and wherein each of a first conductor linewidth and a third conductor linewidth are approximately equal to one-half the first linewidth.

7. The device of claim 4, wherein the second plurality of PCBs includes a second PCB and a fourth PCB, and wherein the second transmission line winding includes a second conductor disposed on the second PCB and a fourth conductor disposed on the fourth PCB, the fourth conductor being disposed in parallel with the second conductor, and wherein each of a second conductor linewidth and a fourth conductor linewidth are approximately equal to one-half the second linewidth.

8. The device of claim 1, wherein the first transmission line winding includes a first-first transmission line segment and a second-first transmission line segment, the first-first transmission line segment and the second-first transmission line segment being wound in opposite directions, and wherein the second transmission line winding includes a first-second transmission line segment and a second-second transmission line segment, the first-second transmission line segment and the second-second transmission line segment being wound in opposite directions.

9. The device of claim 1, wherein the first portion of the first transmission line winding and the second portion of the first transmission line winding form a substantially contiguous at least one first spiral winding, and wherein the first portion of the second transmission line winding and the second portion of the second transmission line winding form a substantially contiguous at least one second spiral winding.

10. The device of claim 9, wherein the at least one first PCB includes a first PCB and a third PCB, and wherein the at least one first spiral winding includes a first spiral winding disposed on the first PCB and a third spiral winding on the third PCB.

11. The device of claim 9, wherein the at least one second PCB includes a second PCB and a fourth PCB, and wherein the at least one second spiral winding includes a second spiral winding disposed on the second PCB and a fourth spiral winding on the fourth PCB.

12. The device of claim 1, wherein the second impedance transformation coupler is coupled to the first impedance transformation coupler by at least one first internal via, and wherein the first balun coupler is coupled to the second balun coupler by at least one second internal via.

13. The device of claim 1, wherein an electrical length of the first portion of the first transmission line winding is different than an electrical length of the second portion of the first transmission line winding, and wherein an electrical length of the first portion of the second transmission line winding is different than an electrical length of the second portion of the second transmission line winding.

14. The device of claim 1, wherein an odd-mode impedance of the plurality of first RF couplers is different than an odd-mode impedance of the plurality of second RF couplers.

15. The device of claim 14, wherein an odd-mode impedance of one of the plurality of first RF couplers is different than an odd-mode impedance of another one of the plurality of first RF couplers.

16. The device of claim 14, wherein an odd-mode impedance of one of the plurality of second RF couplers is different than an odd-mode impedance of another one of the plurality of second RF couplers.

17. The device of claim 1, wherein an electrical line length of the plurality of first RF couplers is different than an electrical line length of the plurality of second RF couplers.

18. The device of claim 17, wherein an electrical line length of one of the plurality of first RF couplers is different than an electrical line length of another one of the plurality of first RF couplers.

19. The device of claim 17, wherein an electrical line length of one of the plurality of second RF couplers is different than an electrical line length of another one of the plurality of second RF couplers.

20. The device of claim 1, wherein $\lambda$ corresponds to a center frequency of a signal bandwidth characterizing return loss, insertion loss or common mode rejection ratio (CMMR), the signal bandwidth being approximately double that of a Guanella balun having a line length equal to $\lambda/4$ and a system impedance, an odd-mode impedance, and an even-mode impedance equal to the system impedance, an odd-mode impedance, and an even-mode impedance of the RF device.

21. The device of claim 1, wherein each of the first RF couplers is comprised of two inter-digitally connected traces vertically aligned and spaced by thin dielectric layers, and wherein each of the second RF couplers is comprised of two inter-digitally connected traces vertically aligned and spaced by the thin dielectric layers.

22. The device of claim 21, wherein each of the first RF couplers and the second RF couplers are wound in a spiral form factor.

23. The device of claim 21, wherein each of the first RF couplers are wound inside corresponding ones of the second RF couplers, the first RF couplers being wound in the same direction as the second RF couplers.

24. The device of claim 21, wherein each of the second RF couplers are wound inside corresponding ones of the first RF couplers, the second RF couplers being wound in the same direction as the first RF couplers.

25. The device of claim 1, wherein the integrated circuit housing is configured as a surface mount (SMT) housing.

26. The device of claim 1, wherein the integrated circuit housing has a device footprint of less than 0.2 square inches.

27. The device of claim 26, wherein the device footprint is approximately equal to about 0.1 square inches.

28. The device of claim 1, wherein the RF device is characterized by an insertion loss bandwidth that is substantially between −0.25 dB and −0.5 dB in a band of frequencies substantially between 190 MHz and 900 MHz, and wherein the insertion loss bandwidth does not include a notch within the band of frequencies.

29. The device of claim 1, wherein the RF device is characterized by a return loss bandwidth that is substantially between −12 dB and −25 dB in a band of frequencies substantially between 190 MHz and 900 MHz, and wherein the return loss bandwidth does not include a notch within the band of frequencies.

30. The device of claim 1, wherein the RF device is characterized by a common mode rejection ratio (CMMR) bandwidth that is less than or equal to −30 dB in a band of frequencies substantially between 120 MHz and 975 MHz.

* * * * *